United States Patent
Lee

(10) Patent No.: US 7,158,436 B2
(45) Date of Patent: Jan. 2, 2007

(54) SEMICONDUCTOR MEMORY DEVICES

(75) Inventor: Cheng-Sheng Lee, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 203 days.

(21) Appl. No.: 11/001,004

(22) Filed: Dec. 2, 2004

(65) Prior Publication Data

US 2006/0120178 A1 Jun. 8, 2006

(51) Int. Cl.
  G11C 5/14 (2006.01)
  G11C 7/10 (2006.01)
  G11C 8/00 (2006.01)
(52) U.S. Cl. ............ 365/226; 365/189.06; 365/189.09; 365/189.11; 365/229; 365/230.03; 365/230.06
(58) Field of Classification Search ................. 365/226, 365/189.09, 189.11, 230.06
See application file for complete search history.

(56) References Cited

U.S. PATENT DOCUMENTS 5,999,475 A * 12/1999 Futatsuya et al. ........... 365/226
6,512,715 B1 * 1/2003 Okamoto et al. ........... 365/227
6,724,648 B1   4/2004 Khellah et al.
2004/0027906 A1 * 2/2004 Itou ............................ 365/226

* cited by examiner

Primary Examiner—Amir Zarabian
Assistant Examiner—Ly Duy Pham
(74) Attorney, Agent, or Firm—Birch, Stewart, Kolasch & Birch, LLP

(57) ABSTRACT

Semiconductor memory devices. A semiconductor memory device includes a booster circuit generating a predetermined power voltage exceeding an external power voltage, a global power line supplying the predetermined power voltage, and a plurality of memory blocks. Each memory block has a local power line, a plurality of functional circuits coupled to the local power lines and a voltage control device coupled between the global power line and the local power line. The voltage control device outputs the predetermined power voltage or a first voltage to the functional circuits through the local power line in a first period and a second period respectively, according to a select signal, wherein the first voltage exceeds the external power voltage but is lower than the predetermined power voltage.

15 Claims, 3 Drawing Sheets

SEMICONDUCTOR MEMORY DEVICES

BACKGROUND

The invention relates to semiconductor memory devices, and more particularly, to semiconductor memory devices with reducing operating voltage in a stand-by state.

Semiconductor memory devices are employed in a variety of portable appliances, and a battery typically serves as a power source. In order to extend battery life as long as possible, current consumption must be reduced both driving and when in a stand-by mode. Therefore, reduced power consumption of a semiconductor memory device is desirable.

In typical semiconductor memory devices, such as dynamic random access memory (DRAM), a word line is boosted to a potential higher than a power supply potential Vcc (hereinafter referred to as a "boosted power supply potential Vpp") in order to store an H (logical high) level which is equal to the power supply potential Vcc in a memory cell.

FIG. 1 shows an internal booster circuit and a word line driving circuit (word line driver) in the conversional DRAM. As shown, an internal booster circuit 20 generates, based on the externally supplied power supply potential Vcc, the boosted power supply potential Vpp exceeding the power supply potential Vcc. A word line driver WD is activated/deactivated in response to a decode signal from a decoder unit DU. Word line driver WD comprises a CMOS inverter including a P channel MOS transistor Q1 and an N channel MOS transistor Q2. The Decoder unit DU and word line driver WD are powered by the boosted power supply potential Vpp from internal booster circuit 20.

Generally, although P channel MOS transistor Q1 is in an off state when in stand-by, a small through current Is (also called subthreshold current) flows from the source to the drain in P channel MOS transistor Q1. The through current Is produced by word line driver WD becomes larger than those in the other transistors in the peripheral circuits.

Since a 64 MB DRAM, for example, includes 32000 word lines and 32000 word line drivers in total, the sum of the through currents grows extremely large. As a result, the output potential of internal booster circuit 20 is reduced from the predetermined boosted power supply potential Vpp. Internal booster circuit 20 operates to return the reduced output potential to the original boosted power supply potential, and thus, current consumption increases.

SUMMARY

An exemplary embodiment of a semiconductor memory device, wherein a booster circuit generates a predetermined power voltage exceeding an external power voltage, a global power line supplies the predetermined power voltage, and a plurality of memory blocks. Each memory block comprises a local power line, a plurality of functional circuits coupled to the local power lines and a voltage control device coupled between the global power line and the local power line. The voltage control device outputs the predetermined power voltage or a first voltage to the functional circuits through the local power line in a first period and a second period respectively, according to a select signal, wherein the first voltage exceeds the external power voltage but lower than the predetermined power voltage.

In some embodiments of a semiconductor memory device, a booster circuit generates, according to an external power voltage, a predetermined power voltage exceeding the external power voltage. A global power line is supplied with the predetermined power voltage from the boosting circuit. At least one memory block comprises a plurality of word lines, a plurality of bit lines crossing the word lines, a plurality of memory cells corresponding to crossing points of the bit lines and the word lines, a local power line, and a voltage control device. The voltage control device is coupled between the global power line and the local power line, outputs the predetermined power voltage to the local power line in a first period, according to a select signal and a first voltage to the local power line in a second period respectively. The first voltage exceeds the external power voltage but is lower than the predetermined power voltage. A plurality of word line drivers correspond to the word lines, each comprising a power terminal coupled to the local power line and outputs the predetermined power voltage from the local power line to drive a corresponding word line in the first period.

DESCRIPTION OF THE DRAWINGS

Semiconductor memory devices can be more fully understood by the subsequent detailed description and examples with reference made to the accompanying drawings, wherein.

DETAILED DESCRIPTION

Figure 2:
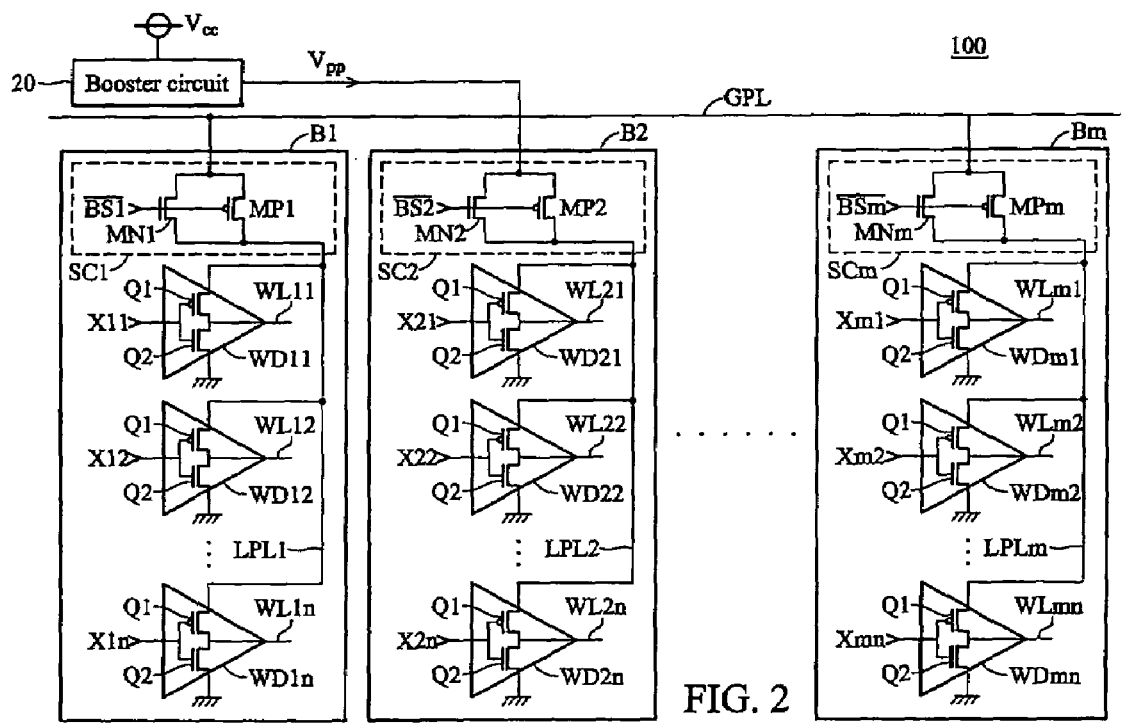
FIG. 2 is an embodiment of a semiconductor memory device.

FIG. 2 is an exemplary embodiment of a semiconductor memory device. As shown, semiconductor memory device 100 comprises a booster circuit 20, a global power line GPL and a plurality of memory blocks B1~Bm. The depicted semiconductor memory device 100 can be a dynamic random access memory (DRAM) comprising row decoders, column decoders, sensing amplifiers, input/output circuits, clock generation circuit (not shown) and others.

Figure 1:
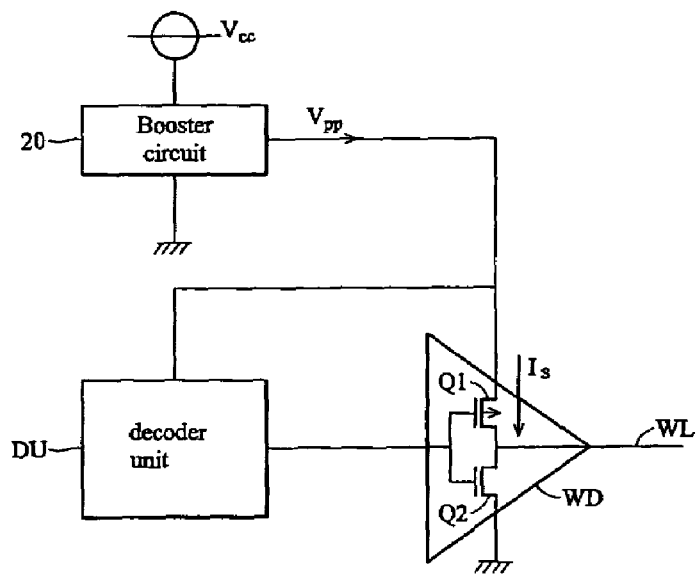
FIG. 1 is a conventional memory device.
Figure 3:
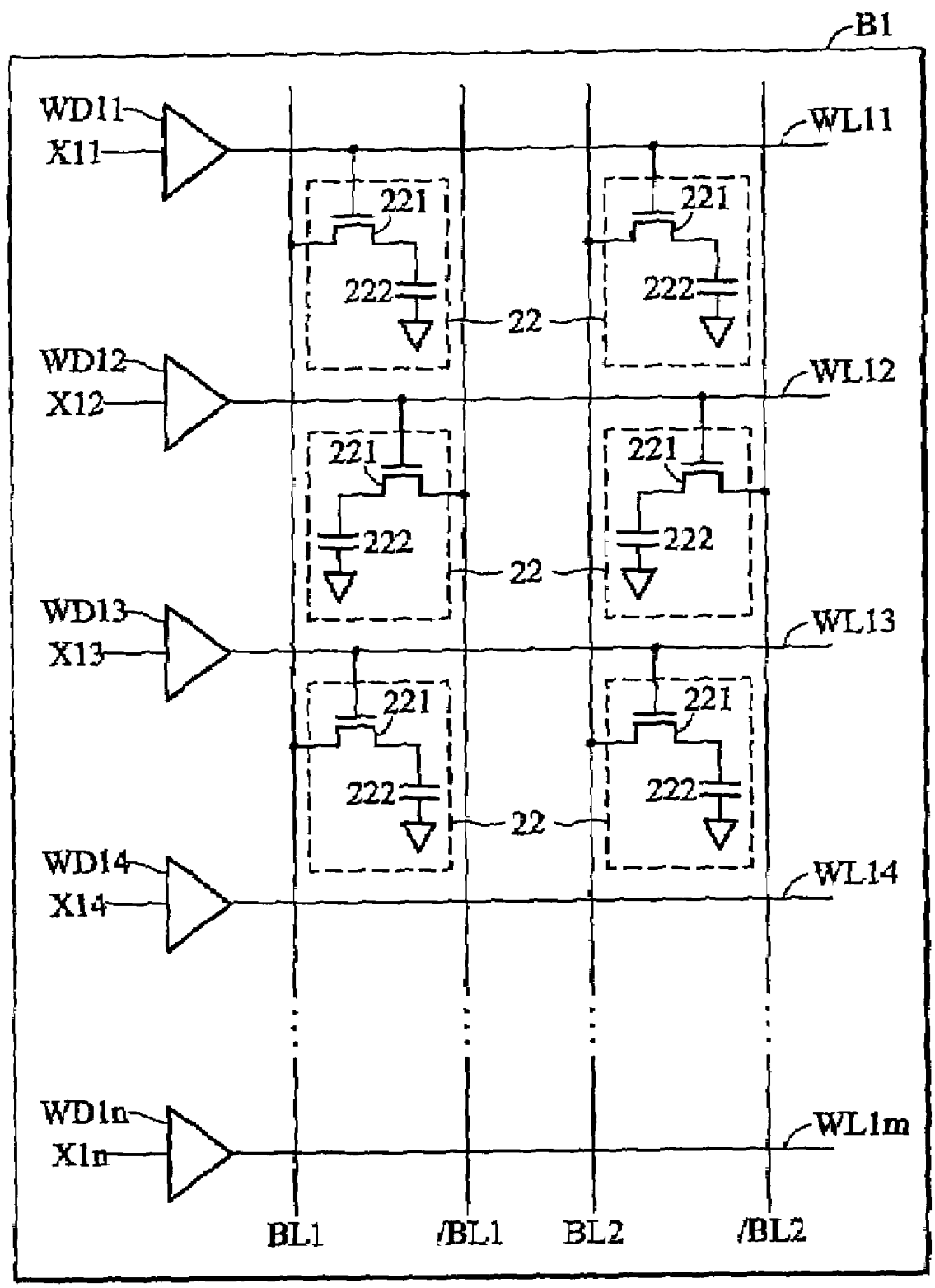
FIG. 3 is an embodiment of a memory block.

As shown in FIG. 2, according to an external power voltage Vcc, such as 1.8V, the booster circuit 20 generates a predetermined power voltage Vpp, such as 3.3V, exceeding the external power voltage Vcc. The global power line GPL is coupled between the booster circuit 20 and the memory blocks B1~Bm. As shown in FIG. 1, the memory blocks B1~Bm each comprise a voltage control device SC1, a local power line, a plurality of word line drivers WD11~WD1n, word lines WL11~WL1n, a plurality of memory cells 22 and a plurality of bit lines BL1, /BL1, BL2 and /BL2 (shown in FIG. 3). The memory blocks B1~Bm have the same structure and operations as those previously described.

The local power line LPL1 is coupled to the power terminal of each word line driver WD11~WD1n. Word line drivers WD11~WD1n drive a corresponding the word line WL11~WL1n according to control signals X11~X1n from row decoders (not shown). Each word line driver WD11~WD1n comprises a PMOS transistor Q1 and an NMOS transistor Q2. The voltage control device SC1 comprises a NMOS transistor MN1 and a PMOS transistor MP1 coupled between the global power line GPL and the local power line LPL1. Control terminals of the transistor MN1 and MP1 are coupled to a selection control signal/BS1. The memory blocks B2~Bm have the same structure as memory block B1. Each memory cell 22 comprises a transistor 221 and a storage capacitor 222, and is coupled to a corresponding word and bit lines.

Operations of the semiconductor memory device 100 are described in the following. According to a row address signal, only one of the block select signal/BS1~/BSm goes low, meanwhile row decoder (not shown) triggers only one of the decode signals X11~Xmn to go low. For example, when block select signal/BS1 goes low, the decode signal X11 goes low, and only the word line driver WD11 is activated. All word line drivers in the memory blocks B2~Bm are deactivated as all the block select signals/BS2~/BSm all go high (stand-by state). Further, the other word line drivers in the memory block B1 are also deactivated as all the decode signals X12~X1n go high.

Due to the low level of the block select signal/BS1, the PMOS transistor MP1 is turned on and the NMOS transistor MN1 is turned off, such that the predetermined power voltage Vpp at the global power line GPL is applied to the local power line LPL1. The word line driver WD11 supplies the predetermined power voltage Vpp to the corresponding word line WL11, activating the word line WL11.

Additionally, the PMOS transistors MP2~MPm in the memory block B2~Bm (during stand-by state) are turned off due to the high level of the block select signals/BS2~/BSm. Thus, the voltage level at the local power lines PLP2~PLPm are clamped at a first voltage Vpp-Vt. The predetermined power voltage Vpp here is 3.3V and Vt, such as 0.7V, is threshold voltage of an NMOS transistor (MP2~MPm). Thus, the first voltage Vpp-Vt of about 2.6V exceeds the external power voltage Vcc (1.8V) but is less than the predetermined power voltage Vpp (3.3V). In other words, only the voltage level of the local power lines LPL2~LPLm is lower than the first voltage (Vpp-Vt), the NMOS transistors MN2~MNm are turned on to power the local power line LPL2~LPLm. Thus, the first voltage (Vpp-Vt) can be the lowest voltage level of the local power line LPL1~LPLm.

Thus, in the unselected memory block, the voltage control circuit only output the first voltage (Vpp-Vt) to power the local power line when the voltage level at the local power line is lower than the first voltage, thereby reducing overall current consumption. Moreover, because the local power line is maintained at least at the voltage level of the first voltage (Vpp-Vt) in the unselected memory block (stand-by state), the voltage level at the local power line can be rapidly return to the voltage level of the predetermined power voltage (Vpp) when the corresponding memory block is again selected, thereby improving the response time for writing memory cells.

Figure 4A:
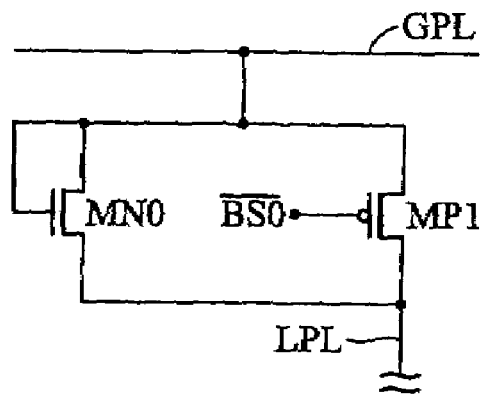
FIG. 4A is an embodiment of a voltage control device.
Figure 4B:
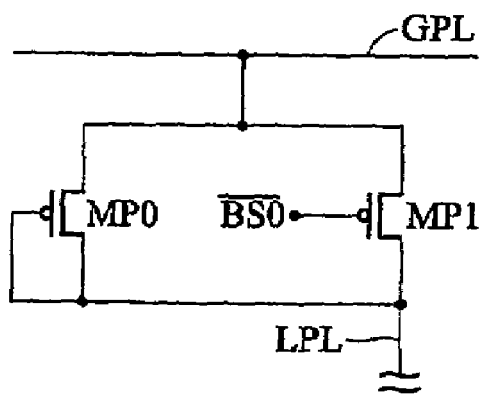
FIG. 4B is an embodiment of a voltage control device.
Figure 4C:
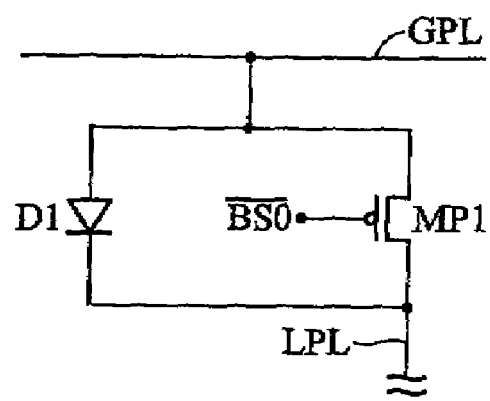
FIG. 4C is an embodiment of a voltage control device.

FIGS. 4A~4C shows several embodiments of voltage control devices. An embodiment of a voltage control device shown in FIG. 4A is similar to that in FIG. 2 except that the NMOS transistor MN0 has a gate terminal coupled to the global power line GPL. The NMOS transistors MN1~MNm of all voltage control devices SC1~SCm can be replaced by NMOS transistors MN0. FIG. 4B shows another embodiment of the voltage control device SC1~SCm. As shown, the voltage control device is similar to those in FIG. 2 except that the PMOS transistor MP0 has a gate terminal coupled to the local power line LPL. The NMOS transistors MN1~MNm of the all voltage control device SC1~SCm can be replaced by NMOS transistors MN0. In the stand-by state, the voltage control devices shown in FIGS. 4A and 4B also can clamp the voltage level at the local power line at a voltage (Vpp-Vt) exceeding the external power voltage Vcc but smaller than the predetermined power voltage Vpp.

FIG. 4C shows another embodiment of the voltage control devices SC1~SCm. As shown, the voltage control device is similar to that in FIG. 2 except that a diode D1 is coupled between the global power line GPL and the local power line LPL. In the stand-by state, the voltage control devices shown in FIG. 4C can also clamp the voltage level at the local power line at a voltage Vpp-Vt, in which Vt is a threshold voltage of the diode D1.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprising:
  a booster circuit for generating, according to an external power voltage, a predetermined power voltage exceeding the external power voltage;
  a global power line supplied with the predetermined power voltage from the booster circuit; and
  at least one memory block comprising:
    a plurality of word lines;
    a plurality of bit lines crossing the word lines;
    a plurality of memory cells corresponding to crossing points of the bit lines and the word lines;
    a local power line;
    a voltage control device, coupled between the global power line and the local power line, outputting the predetermined power voltage according to a select signal to the local power line in a first period and outputting a first voltage to the local power line in a second period, wherein the first voltage exceed the external power voltage but lower than the predetermined power voltage; and
    a plurality of word line drivers corresponding to the word lines, each comprising a power terminal coupled to the local power line and outputting the predetermined power voltage from the local power line to drive a corresponding word line in the first period.

2. The semiconductor memory device as claimed in claim 1, wherein the predetermined power voltage and the first power voltage have a voltage difference equal to a threshold voltage of a transistor.

3. The semiconductor memory device as claimed in claim 1, wherein the voltage control device comprises:
  a PMOS transistor coupled between the global power line and the local power line, comprising a control terminal coupled to the select signal; and
  a NMOS transistor coupled between the global power line and the local power line, comprising a control terminal coupled to the select signal.

4. The semiconductor memory device as claimed in claim 1, wherein the voltage control device comprises:
  a PMOS transistor coupled between the global power line and the local power line, comprising a control terminal coupled to the select signal; and
  a NMOS transistor coupled between the global power line and the local power line, comprising a control terminal coupled to the global power line.

5. The semiconductor memory device as claimed in claim 1, wherein the voltage control device comprises:

a first PMOS transistor coupled between the global power line and the local power line, comprising a control terminal coupled to the select signal; and a second PMOS transistor coupled between the global power line and the local power line, comprising a control terminal coupled to the local power line.

6. The semiconductor memory device as claimed in claim 1, wherein the voltage control device comprises:

a PMOS transistor coupled between the global power line and the local power line, comprising a control terminal coupled to the select signal; and a diode coupled between the global power line and the local power line, wherein the predetermined power voltage and the first power voltage have a voltage difference equal to a threshold voltage of the diode.

7. The semiconductor memory device as claimed in claim 1, wherein the semiconductor memory device is a dynamic random access memory (DRAM).

8. A semiconductor memory device, comprising:

a booster circuit for generating, according to an external power voltage, a predetermined power voltage exceeding the external power voltage;

a global power line supplied with the predetermined power voltage from the boosting circuit; and a plurality of memory blocks, each comprising:
  a local power line;
  a plurality of functional circuits coupled to the local power lines, carrying out a predetermined operation; and
  a voltage control device, coupled between the global power line and the local power line, outputting the predetermined power voltage according to a select signal to the functional circuits through the local power line in a first period and outputting a first voltage to the functional circuits through the local power line in a second period, wherein the first voltage exceeds the external power voltage but is lower than the predetermined power voltage.

9. The semiconductor memory device as claimed in claim 1, wherein the functional circuits each comprises:

a plurality of word lines;
a plurality of bit lines crossing the word lines;
a plurality of memory cells corresponding to crossing points of the bit lines and the word lines; and
a plurality of word line drivers corresponding to the word lines, each comprising a power terminal coupled to the local power line and outputting the predetermined power voltage from the local power line to drive a corresponding word line in the first period.

10. The semiconductor memory device as claimed in claim 9, wherein the predetermined power voltage and the first power voltage have a voltage difference equaled to a threshold voltage of a transistor.

11. The semiconductor memory device as claimed in claim 9, wherein the voltage control device comprises:

a PMOS transistor coupled between the global power line and the local power line, comprising a control terminal coupled to the select signal; and a NMOS transistor coupled between the global power line and the local power line, comprising a control terminal coupled to the select signal.

12. The semiconductor memory device as claimed in claim 9, wherein the voltage control device comprises:

a PMOS transistor coupled between the global power line and the local power line, comprising a control terminal coupled to the select signal; and a NMOS transistor coupled between the global power line and the local power line, comprising a control terminal coupled to the global power line.

13. The semiconductor memory device as claimed in claim 9, wherein the voltage control device comprises:

a first PMOS transistor coupled between the global power line and the local power line, comprising a control terminal coupled to the select signal; and a second PMOS transistor coupled between the global power line and the local power line, comprising a control terminal coupled to the local power line.

14. The semiconductor memory device as claimed in claim 9, wherein the voltage control device comprises:

a PMOS transistor coupled between the global power line and the local power line, comprising a control terminal coupled to the select signal; and a diode coupled between the global power line and the local power line, wherein the predetermined power voltage and the first power voltage have a voltage difference equal to a threshold voltage of the diode.

15. The semiconductor memory device as claimed in claim 9, wherein the semiconductor memory device is a dynamic random access memory (DRAM).

* * * * *